United States Patent
Watanabe (10) Patent No.: US 7,733,152 B2
(45) Date of Patent: Jun. 8, 2010

(54) CONTROL SIGNAL GENERATING CIRCUIT ENABLING VALUE OF PERIOD OF A GENERATED CLOCK SIGNAL TO BE SET AS THE PERIOD OF A REFERENCE SIGNAL MULTIPLIED OR DIVIDED BY AN ARBITRARY REAL NUMBER

(75) Inventor: Takamoto Watanabe, Nagoya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 12/324,287

(22) Filed: Nov. 26, 2008

(65) Prior Publication Data
US 2009/0160501 A1 Jun. 25, 2009

(30) Foreign Application Priority Data
Dec. 20, 2007 (JP) .............................. 2007-329107

(51) Int. Cl.
*G06F 1/04* (2006.01)
(52) U.S. Cl. ......................................... 327/291; 331/60
(58) Field of Classification Search ....................... None
See application file for complete search history.

(56) References Cited

U.S. PATENT DOCUMENTS

| 5,416,444 | A | 5/1995 | Yamauchi et al. |
| 5,477,196 | A | 12/1995 | Yamauchi et al. |
| 5,517,155 | A | 5/1996 | Yamauchi et al. |
| 5,528,200 | A | 6/1996 | Yamauchi et al. |
| 6,523,108 | B1 * | 2/2003 | James et al. ................. 712/224 |
| 7,336,111 | B2 * | 2/2008 | Lin et al. ..................... 327/158 |

FOREIGN PATENT DOCUMENTS

| JP | H06-216721 | 8/1994 |
| JP | H07-183800 | 7/1995 |
| JP | H07-283722 | 10/1995 |

* cited by examiner

*Primary Examiner*—Cassandra Cox
(74) *Attorney, Agent, or Firm*—Posz Law Group, PLC (57) ABSTRACT

A pulse signal circulates around a ring of delay elements with respective traversal signals being thereby successively outputted from the delay elements. The period of a reference signal is multiplied or divided by a real number to obtain control data specifying a required period of a clock signal as a value having an integer part and a fractional part. The control data are used to select the timings of specific traversal signal, and the clock signal is generated based these selected timings, with the timing selection being repetitively adjusted in accordance with the fractional part of the control data.

11 Claims, 7 Drawing Sheets

FIG. 10

CONTROL SIGNAL GENERATING CIRCUIT ENABLING VALUE OF PERIOD OF A GENERATED CLOCK SIGNAL TO BE SET AS THE PERIOD OF A REFERENCE SIGNAL MULTIPLIED OR DIVIDED BY AN ARBITRARY REAL NUMBER

CROSS-REFERENCE TO RELATED APPLICATIONS

This application is based on and incorporates herein by reference Japanese Patent Application No. 2007-329107 filed on Dec. 20, 2007.

BACKGROUND OF THE INVENTION

1. Field of Application

The present invention relates to a control signal generating circuit and to a method of using the control signal generating circuit. In particular, the invention relates to a control signal generating circuit which generates a clock signal based on applying frequency multiplication or frequency division to a reference signal, and to a method of using such a circuit.

2. Description of Related Technology

A type of PLL (phase locked loop) circuit is known (for example as described in Japanese Patent First Publication No. 7-183800, referred to in the following as reference document 1) whereby a reference signal is frequency-stabilized by being generated using a quartz crystal vibrator and wherein periods of the reference signal are counted by using a high-frequency clock signal having a frequency that is sufficiently higher than that of the reference signal. The resultant count value is used to derive a clock signal through multiplying or dividing the period of the reference signal.

Figure 8:
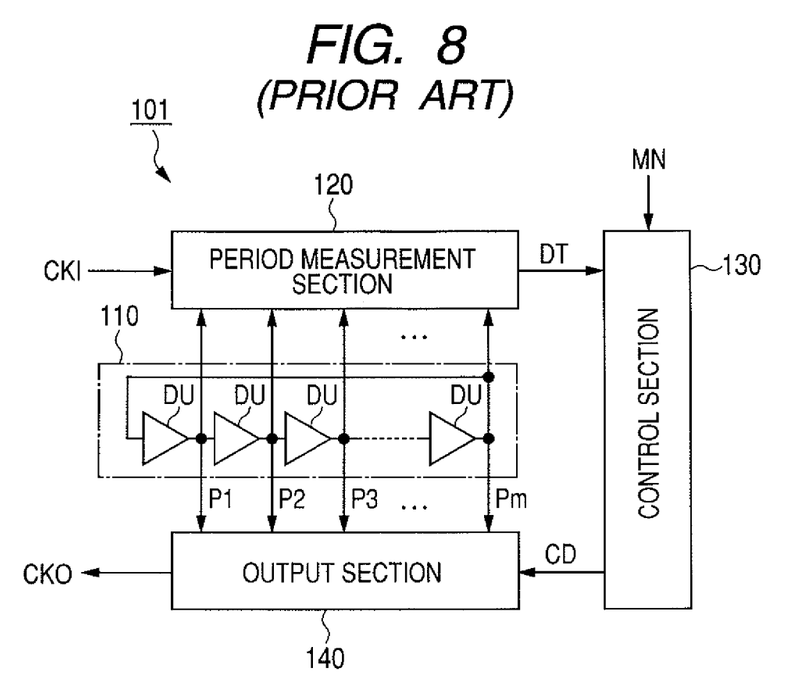
FIG. 8 is a block diagram showing the configuration of a prior art clock signal generating circuit.

An example of such a PLL circuit is shown in FIG. 8. Here, the clock signal generating circuit 101 includes a pulse delay circuit 110, a period measurement section 120, a control section 130 and an output section 140. The pulse delay circuit 110 is made up of a plurality of delay elements DU connected in a ring configuration, around which a pulse signal successively circulates, being sequentially delayed by the delay elements. The period measurement section 120 generates period data D expressing the value of period of a reference signal CKI by determining the number of delay elements DU that are traversed by the pulse signal during each interval between a rising edge of the clock signal CKI and a succeeding rising edge, and converting the number to a binary digital value. This is done based on traversal signals P1~Pm which are successively outputted from the respective delay elements DU of is the pulse delay circuit 110, (where "traversal signals" signifies successive outputs of the pulse signal from respective delay elements).

The control section 130 generates control data CD expressing a required value of period of a clock signal CKO that is to be generated. This is done by multiplying or dividing the period data DT from the period measurement section 120 by a set value MN. The output section 140 operates based on the control data CD and on the traversal signals P1~Pm, to generate the clock signal CKO with a period that is equal to the period of the reference signal CKI multiplied by the set value MN.

Figure 9:
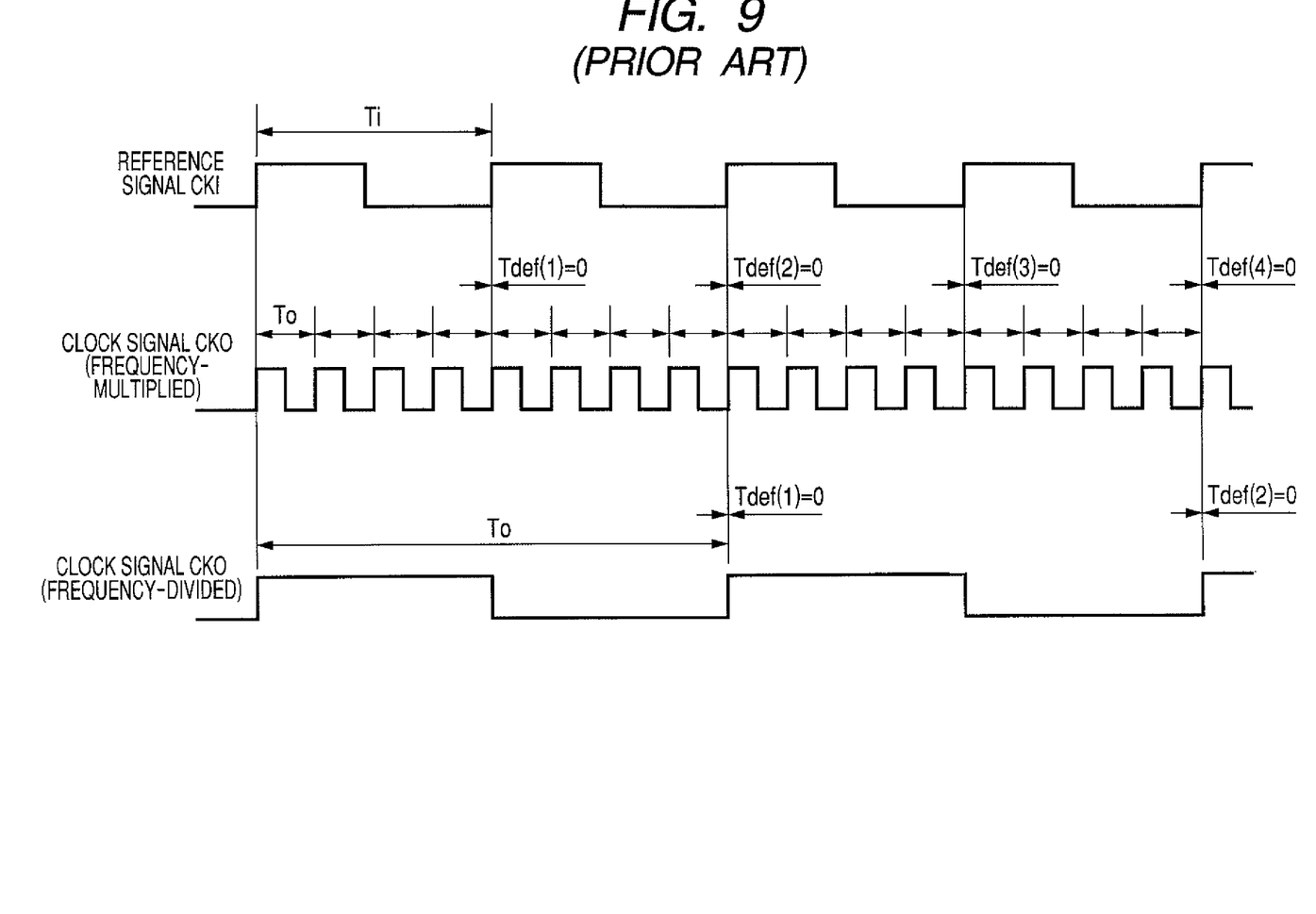
FIG. 9 is a timing diagram showing relationships between a reference signal and a generated clock signal, in the prior art clock signal generating circuit.

However as illustrated in FIG. 9, with this prior art example, it is necessary that the phase of the clock signal CKO be locked to the phase of the reference signal CKI. That is to say, the phase difference Tdef(k) (where k=1, 2, ... ) between each rising edge of a specific one of the clock signal CKO and reference signal CKI and the succeeding rising edge of the other one of these signals is made equal to zero, where the specific signal is the one of the clock signal CKO and reference signal CKI having the lower frequency of the two signals.

Hence it is necessary that each possible frequency value which can be set as the frequency of the clock signal CKO must be equal to the frequency of the reference signal CKI multiplied by an integer, or multiplied by 1 divided by an integer. That is to say, the set value MN is restricted to being an integer, or 1 divided by an integer. Hence, the number of possible frequencies that can be set for the clock signal CKO (by using a single reference signal frequency) is substantially limited, which is a severe design restriction. More specifically, a single reference signal frequency cannot be used for selectively generating an arbitrary one of a plurality of clock signals that successively differ in frequency by only a small amount.

Thus, when it is necessary that the clock signal CKO can be generated at any of a plurality of respectively different frequencies, it may not be possible to obtain all of these clock signal frequencies through multiplying the frequency of the reference signal CKI by an integer or by 1 divided by an integer. Hence in such a case it becomes necessary to use a plurality of reference signals CKI having respectively different frequencies, in order to be able to generate the clock signal CKO at all of the required frequencies.

SUMMARY OF THE INVENTION

It is an objective of the present invention to overcome the above problems, by providing a clock signal generating circuit for generating a clock signal having a frequency that is a multiple or a fraction of the frequency of a reference signal, whereby arbitrary values of clock signal frequency can be established by using a single reference signal. Specifically, it is an objective to provide such a clock signal generating circuit, whereby a required value of period of a generated clock signal can be specified as being the period value of a reference signal multiplied by (or divided by) a value that is not restricted to being an integer.

To achieve the above objective, the invention provides a clock signal generating circuit comprising:

a pulse delay circuit formed of a plurality of delay elements connected in a ring configuration, with a pulse signal successively traversing the delay elements (i.e., successively circulating around the ring);

a period measurement circuit that is supplied with a fixed-period reference signal, and which detects the period of the reference signal as a number of stages of the delay elements that are traversed by the pulse signal, and generates period data expressing the period in units of the average delay time of the delay elements;

control circuitry which multiplies the period data by a predetermined set value when the period of the clock signal is to be determined by frequency division of the reference signal and divides the period data by the set value when the period of the clock signal is to be determined by frequency multiplication of the reference signal, thereby obtaining control data that expresses a required value of clock signal period; and output circuitry which generates the clock signal based on traversal signals that are respectively outputted from the delay elements of the pulse delay circuit, with the clock signal period having the value expressed by the control data.

Specifically with the present invention, a real number can be utilized as the set value. Thus with such a clock signal generating circuit, the control data can express a period value that is a real number, i.e., is not restricted to being an integer.

Hence, the possible values that can be set for the clock signal are not limited to being equal to the period of the reference signal multiplied or divided by an integer, as has been the case with the prior art, so that arbitrary values of clock signal frequency can be specified while utilizing only a single reference signal frequency.

It thereby becomes possible to provide an apparatus capable of generating a plurality of different clock signal frequencies, at low cost. The real number that is to be utilized as the set value is preferably held in a register, and so can be freely altered as required.

In addition, an even wider range of possible values of clock signal frequency can be achieved by incorporating a selector which can be operated to select one of a plurality of reference signals having respectively different frequency values, to be supplied as the reference signal for the clock signal generating circuit.

When such a clock signal generating circuit, when the control circuitry produces a real number as control data expressing the required period of the clock signal, so that the control data has an integer part and a fractional part, the output circuit preferably comprises an adjustment circuit and a timing selection circuit that is controlled by the adjustment circuit. At each period of the output clock signal, the adjustment circuit sets the integer part of the control data, or that integer part incremented by 1, as a selection value. The ratio of the number of times (e.g., as measured over a fixed number of successive clock signal periods) that the selection value is set unchanged to the number of times that the selection value is incremented by 1 is determined in accordance with the fractional part of the control data.

As the pulse signal circulates around the pulse delay circuit, traversal signals are successively outputted from the respective delay elements. In each period of the generated clock signal, the pulse selection circuit selects the traversal signal from a specific one of the delay elements, with the selection being based upon the selection value. The subsequent timing of a traversal signal produced from the selected delay element (referred to herein as a boundary timings) defines the start timing of the next period of the output clock signal. Specifically, a clock boundary signal is generated which expresses these boundary timings, and the output clock signal is generated based on that clock boundary signal.

In that way, although the output clock signal is not held continuously synchronized with the reference signal, the value of the clock signal period is effectively fixed at a value that is equal to the period of the reference signal multiplied by (or divided by) a real number. Hence the clock signal frequency can be arbitrarily determined, since the set value is not restricted to being an integer.

In order to minimize the number of delay elements required to form the pulse delay circuit, the clock signal generating circuit preferably further comprises a counter circuit which counts the number times the pulse signal circulates around the pulse delay circuit, and the integer part of the control data is handled as a set of high-order bits and a set of low-order bits. In that case, at each period of the output clock signal, the adjustment circuit sets the selection value as being either the value expressed by the low-order bits of the integer part of the control data, or that value incremented by one, with the ratio of the respective setting conditions being determined in accordance with the fractional part of the control data as described above. Each time the pulse signal has circulated around the pulse selection circuit a number of times (as detected by the counter circuit) that is equal to the value expressed by the high-order bits of the control data, the operation of the pulse selection circuit is initiated, to determine the next boundary timing in accordance with the selection value at that time.

DESCRIPTION OF PREFERRED EMBODIMENTS

Figure 1:
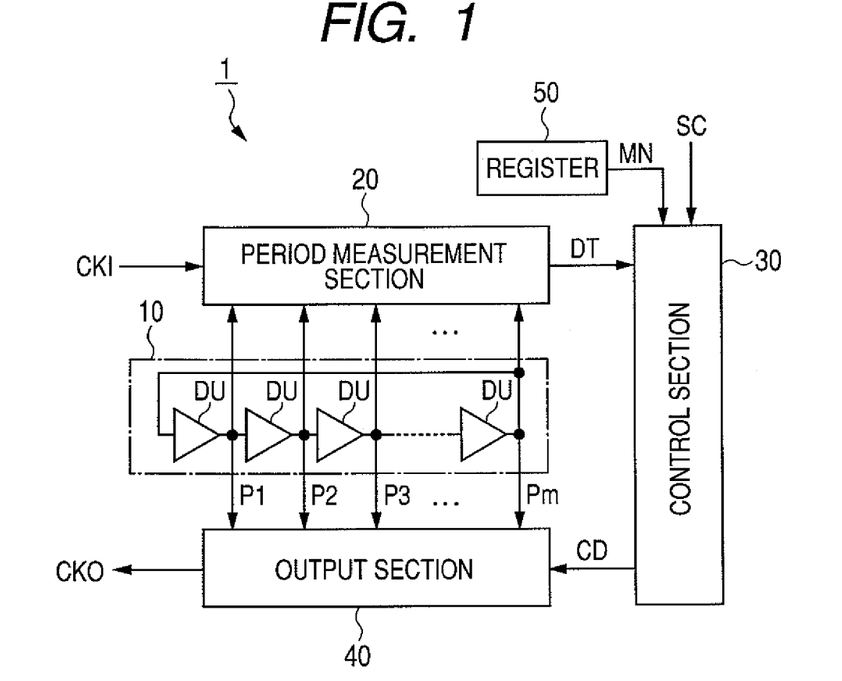
FIG. 1 is a block diagram showing the overall configuration of a first embodiment of a clock signal generating circuit.

FIG. 1 shows the overall configuration of an embodiment of a clock signal generating circuit designated by reference numeral 1. As shown, the clock signal generating circuit 1 is formed of a pulse delay circuit 10, a period measurement section 20, a control section 30, an output section 40 and a set value register 50. The pulse delay circuit 10 is formed of m delay elements DU (where m=$2^p$ and p is an integer and where p=4 with this embodiment) connected sequentially in a ring configuration. Each of the delay elements DU successively delays a pulse signal which circulates around the ring of delay elements. The period measurement section 20 obtains the phase difference between successive rising edges of a reference signal CKI, based on traversal signals P1~Pm that are successively outputted from the delay elements DU of the pulse delay circuit 10 as they are traversed by the pulse signal, and converts the result to binary digital data designated as period data DT, expressing the period of the reference signal CKI as measured in units of average delay time of the delay elements DU. The set value register 50 stores a set value MN which is a real number and is used in multiplying or dividing operations as described in the following. The control section 30 generates control data CD that expresses a required value of clock signal period for an output clock signal CKO, obtained by multiplying or dividing the period data DT by the set value MN. The output section 40 generates the output clock signal CKO, having a period that is equal to the period of the reference signal CKI multiplied by (or divided) by the set value MN, based on the traversal signals P1~Pm that are outputted from the pulse delay circuit 10.

Pulse Delay Circuit

Each of the delay elements DU of the pulse delay circuit 10 is formed of one or more CMOS inverter gate circuits connected in series. The pulse delay circuit 10 of this embodiment is shown as being formed only of delay elements DU. However as is well known in the related art (for example as described in reference document 1) it is necessary to use a circuit configuration whereby pulses are supplied to the pulse delay circuit 10 for activating the transfer of a pulse signal through the delay elements DU, and to configure the circuit such that the pulse signal will continuously circulate around the ring of delay elements of the pulse delay circuit 10. However details are omitted herein, for brevity of description.

Frequency Measurement Section

Figure 2:
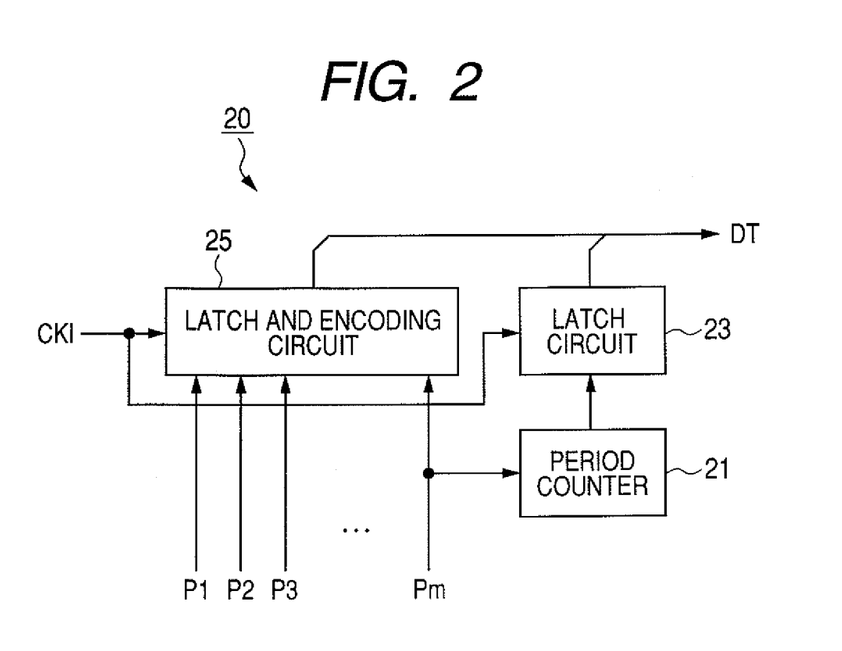
FIG. 2 is a block diagram of a period measurement section in the first embodiment.

As shown in FIG. 2, the period measurement section 20 is formed of a period counter 21, a latch circuit 23 and a latch and encoding circuit 25. The period counter 21 counts the number of times that the pulse signal circulates around the pulse delay circuit 10, based on the traversal signal Pm. The latch circuit 23 latches the output (count value) from the period counter 21, at the timing of a rising edge of the reference signal CKI. The latch and encoding circuit 25 latches the traversal signals P1~Pm at the timing of a rising edge of the reference signal CKI, and encodes the position of the pulse signal as p bits of binary data, based on the latched results. The value held in the latch circuit 23 is outputted as the high-order bits of the period data DT, while the p bits that are held in the latch and encoding circuit 25 are outputted as the low-order bits of the period data DT.

Hence the period measurement section 20 outputs period data DT that express the period of the reference signal CKI as an integer value, measured in units of average delay time of the delay elements DU of the pulse delay circuit 10.

Control Section

Figure 3:
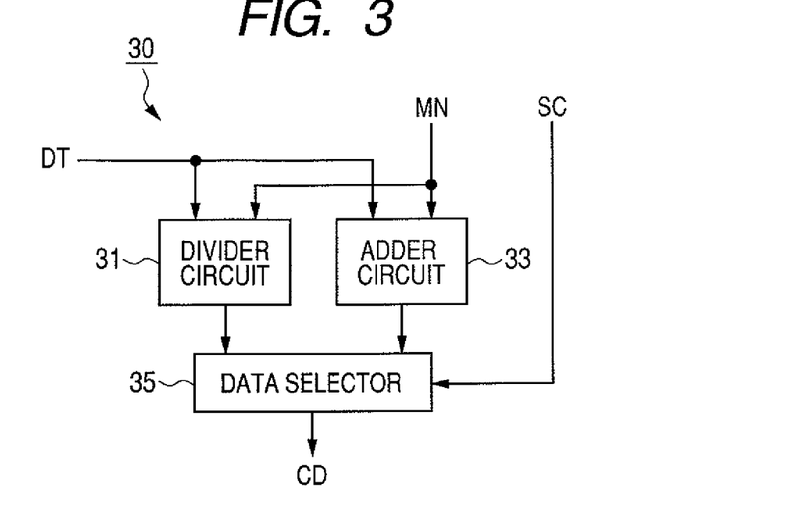
FIG. 3 is a block diagram of a control section in the first embodiment.

As shown in FIG. 3, the control section 30 is made up of a divider circuit 31, a multiplier circuit 33 and a selector 35. The divider circuit 31 performs division calculations on the period data DT by using the set value MN held in the set value register 50 as the divisor, and the multiplier circuit 33 performs multiplication calculations on the period data DT by using the set value MN as the multiplier. The selector 35 selects the calculation result from the divider circuit 31 or from the multiplier circuit 33, in accordance with a calculation selector signal SC, and outputs the selection results as the control data CD, which are supplied to the output section 40.

The set value register 50 is configured to store real numbers, and each of the divider circuit 31 and multiplier circuit 33 is configured to output a calculation result which is a real number formed of an integer part consisting of "a" bits (where a>p) and a fractional part consisting of "b" bits (where b=10~12).

Output Section

Figure 4:
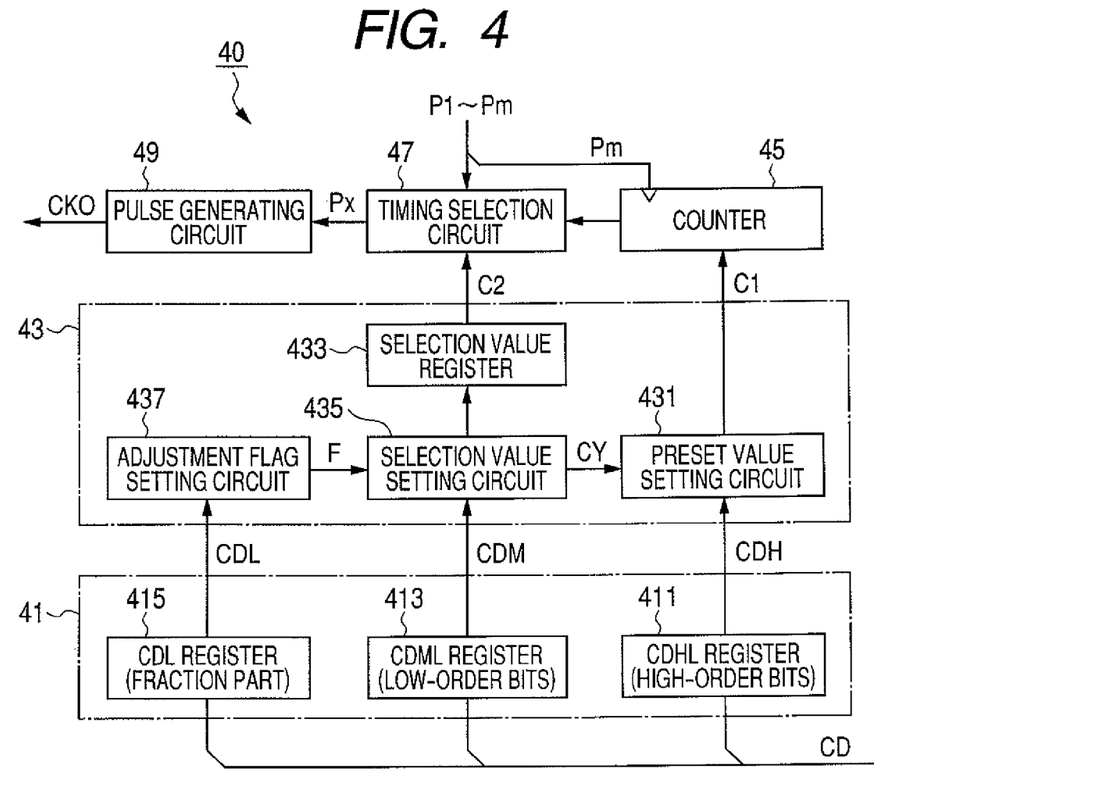
FIG. 4 is a block diagram of an output section in the first embodiment.

As shown in FIG. 4, the output section 40 is formed of a control value register 41, an output control circuit 43, a down-counter 45, a timing selection circuit 47 and a pulse generating circuit 49. The control value register 41 stores the control data CD. The output control circuit 43 generates a preset value C1 and a pulse selection value C2 as described hereinafter, in accordance with values held in the control value register 41. The down-counter 45 is repetitively preset to the value C1 from the output control circuit 43, and performs down-counting of the traversal signal Pm. Each time the count value returns to zero, a signal supplied from the down-counter 45 causes the timing selection circuit 47 to then select (in accordance with the pulse selection value C2) the timing of a specific one of the traversal signals P1~Pm as a boundary timing (i.e., the timing at which the next period of the clock signal CKO is to begin). These boundary timings are expressed by a boundary timing signal Px that is outputted from the timing selection circuit 47 and supplied to the pulse generating circuit 49, i.e., the timing selection circuit 47 and the down-counter 45 together constitute a clock boundary signal generating circuit. The pulse generating circuit 49 generates the clock signal CKO by producing an output pulse at each of the boundary timings expressed by the boundary timing signal Px.

Control Value Register

The control value register 41 is formed of a CDH register 411, a CDM register 413 and a CDL register 415. The CDH register 411 holds integer part high-order data CDH constituted by the high-order (a−p) bits of the integer part of the control data CD, and the CDM register 413 holds integer part low-order data CDM constituted by the low-order p bits of that integer part of the control data CD. The CDL register 415 holds fractional part data CDL constituted by the fractional part of the control data CD.

Output Control Circuit

The output control circuit 43 is formed of a preset value setting section 431, a selection value register 433, a selection value setting section 435 and an adjustment flag setting section 437. When a carry output CY is not being produced from the selection value setting section 435 (i.e., CY is at logic "0"), the preset value setting section 431 sets the integer part high-order data CDH directly into the down-counter 45, as a count value C1 to which the counter is preset. When the carry output CY is generated (i.e., goes to logic "1"), the preset value setting section 431 increments the integer part high-order data CDH by one, and sets the result into the down-counter 45, as the preset value C1.

The selection value register 433 holds a pulse selection value C2, having p bits, which is supplied to the timing selection circuit 47 for determining the one of the traversal signals P1~Pm whose timing is to be selected as the next boundary timing.

When an adjustment flag F produced from the adjustment flag setting section 437 is not set (i.e., has a "0" value), the selection value setting section 435 sets the pulse selection value C2 held in the selection value register 433 as the integer part low-order data CDM, held in the CDM register 413. When the adjustment flag F is set (i.e., is "1"), the selection value setting section 435 increments the integer part low-order data CDM by one, and sets the result in the selection value register 433 as the pulse selection value C2.

If a carry is produced as a result of incrementing the integer part low-order data CDM by one, then the carry signal CY is generated by the selection value setting section 435, and supplied to the preset value setting section 431.

Figure 10:
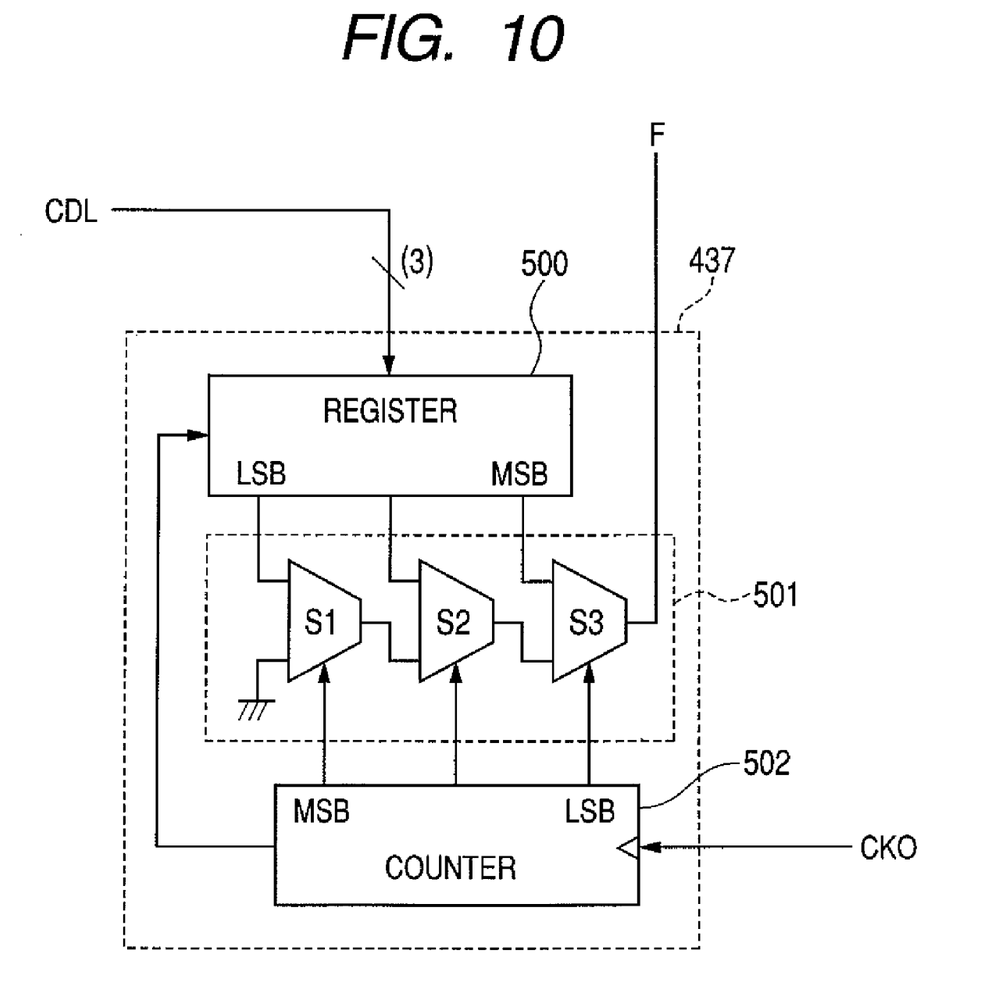
FIG. 10 is a circuit diagram of an example of an adjustment flag setting circuit.

The adjustment flag setting section 437 serves to output the adjustment flag F at either the "1" or "0" state in each of successive periods of the clock signal CKO, in a proportion of occurrences of the "1" state to occurrences of the "0" state that is determined in accordance with the value of the fractional part data CDL, held in the CDL register 415. This will be described referring to a simple example of a circuit configuration for the adjustment flag setting section 437, shown in FIG. 10. Such a type of circuit is described for example in Japanese Patent First Publication No. 07-283722. In FIG. 10 it is assumed that the fractional part data CDL is formed of three bits. Hence in this case the adjustment flag setting section 437 could be formed of a 3-bit register 500, three selectors S1, S2, S3 connected in series as shown, and a 3-bit (i.e., base-8) counter 502. The output signals from the three counter stages of the counter 502 are applied to respective selection control terminals of the selectors S1, S2, S3, and the bits of the fractional part data CDL are respectively supplied to corresponding input terminals of the selectors S1, S2, S3. The other input terminal of the first-stage selector S1 is connected to the logic "0" potential, and the adjustment flag F is outputted from the final-stage selector S3. Each time the count of the counter 502 reaches zero, the fractional part data CDL is loaded into the register 500. The boundary timing signal Px is applied to the count input terminal of the counter 502, so that successive occurrences of the aforementioned boundary timings are counted, i.e., successive clock signal periods are counted.

It will be understood that with the circuit of FIG. 10, the number of times that the adjustment flag F is set to the "1" state during each set of 8 successive periods of the clock signal CKO is within a range from zero to seven, and is determined by the fractional part data CDL. For example if that value is binary "001" then the flag F will be set to "1" once in 8 successive periods of the clock signal CKO.

It will be further understood that the selection value setting section 435 and the adjustment flag setting section 437, in combination, serve to update the pulse selection value C2 and the state of the adjustment flag F, based on the fractional part data CDL and the integer part low-order data CDM of the control data CD, once in each period of the clock signal CKO. It will moreover be understood that that the timing selection circuit 47 selects each boundary timing (i.e., timing of a specific one of the traversal signals P1~Pm) by a selection operation that is initiated each time the down-counter 45 attains a count of zero, after the down-counter 45 has counted a number times that the pulse signal has circulated (around the delay elements of the pulse delay circuit 10) that is equal to the preset value C1.

Thus for example, if the control data CD is 2325.58, i.e., the fractional part CDL is 0.58, then as a result of the above-described operation of the output control circuit 43, 58% of the value of period of the clock signal CKO correspond to the delay time of 2326 stages of the delay elements DU, and 42% corresponds to the delay time of 2325 stages of the delay elements DU.

Operation

Figure 5:
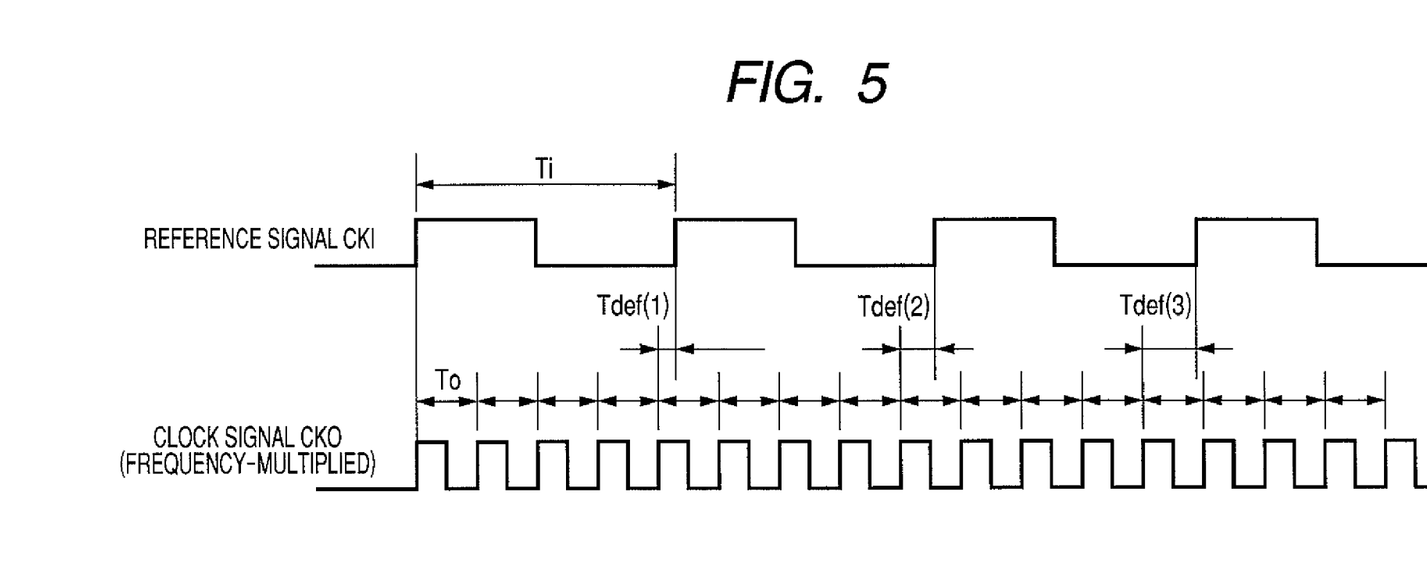
FIG. 5 is a timing diagram showing relationships between a reference signal and a generated clock signal, when the clock signal is obtained by frequency multiplication.
Figure 6:
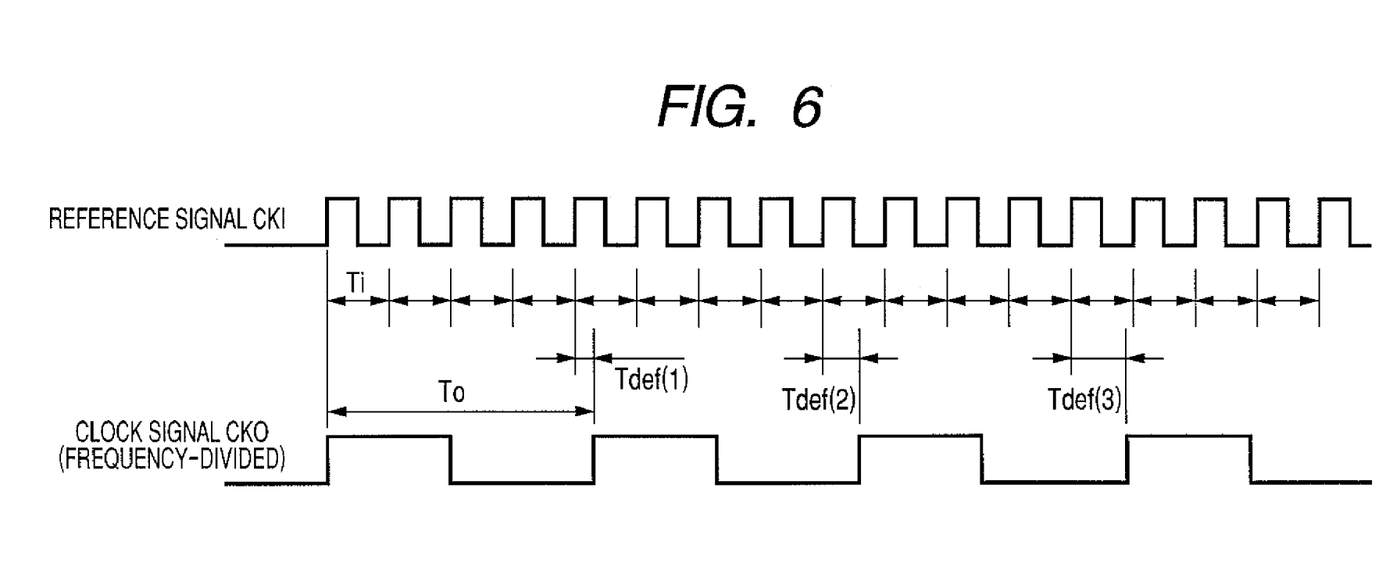
FIG. 6 is a timing diagram showing relationships between a reference signal and a generated clock signal, when the clock signal is obtained by frequency division.

FIG. 5 is a timing diagram showing the relationship between the reference signal CKI and the clock signal CKO for the case in which the set value MN is 4.3 and the calculation selection signal SC is set for a division calculation (i.e., frequency multiplication of the reference signal CKI). FIG. 6 is a timing diagram showing the relationships between the reference signal CKI and clock signal CKO when the set value MN is 4.3 and the calculation selection signal SC is set for a multiplication calculation (i.e., frequency division of the reference signal CKI).

Referring to FIG. 5, if it is assumed for example that the period of the reference signal CKI is 10 μs and the delay value of each of the delay elements DU (i.e., the delay resolution) is 1 ns, then the period data DT is 10,000, and the control data CD is 2325.58 (since DT/MN=10000/4.3).

That is to say, one period (1×Ti) of the reference signal CKI corresponds to 4.3 periods (4.3×To) of the clock signal CKO. Specifically, as illustrated in FIG. 5, counting from a condition in which a rising edge of the lower-frequency one of the reference signal CKI and clock signal CKO (in this case, the reference signal CKI) is synchronized with a rising edge of the other signal (in this case, the clock signal CKO), subsequent values of phase difference Tdef(k) between each rising edge of that lower-frequency signal and the higher-frequency signal are as follows (where k=1, 2, 3):

$Tdef(1)=DT-CD\times4\cong700$ ns $Tdef(2)=2\times DT-CD\times8\cong1400$ ns $Tdef(3)=3\times DT-CD\times12\cong2100$ ns Hence, clock signal edges of the reference signal CKI and the clock signal CKO do not always coincide, i.e., the clock signal CKO is generated asynchronously with respect to the reference signal CKI (in this example, with a period that is a multiple of the period of the reference signal CKI).

Referring to the example of FIG. 6, 4.3 periods of the reference signal CKI (i.e., 4.3×Ti) corresponds to one period (1×To) of the clock signal CKO. Hence the phase difference Tdef(k) between rising edges of the reference signal CKI and clock signal CKO (as measured at the k-th rising edge of the lower-frequency one of the signals CKI, CKO, where k=1, 2, 3) will not always be zero. In this case the clock signal CKO is derived by frequency division of the reference signal CKI, but is asynchronous with respect to the reference signal CKI.

Thus as can be understood from the above, the clock signal generating circuit 1 is configured such that the control data CD which expresses the period of the clock signal CKO is calculated from the period data DT that expresses the period of the reference signal CKI, with the calculation being either a division or a multiplication operation. When this is done, a real number is used as a set value that constitutes the divisor (in the case of a division calculation) or a multiplier (in the case of a multiplication calculation).

Hence the control data CD can be set to an arbitrary value, so that it is not necessary that the desired period of the output clock signal CKO be made equal to the period data DT multiplied by an integer or divided by an integer. Thus the invention enables the clock signal CKO to be generated at an arbitrarily set frequency.

Furthermore, the clock signal generating circuit 1 is configured such that the period of the clock signal CKO is specified by using the control data CD expressing a real number, with the period of the clock signal CKO being determined by the integer portions CTH and CDM of the control data CD, modified in accordance with the fractional part CDL of the control data CD. That is to say, as described above, when the fractional part data CDL is non-zero, the integer part low-order data CDM is selectively incremented by 1 to obtain the pulse selection value C2 which determines the boundary timings and hence the value of period of the clock signal CKO, with occurrences of these incrementing operations being determined by the value of the fractional part data CDL (as described in detail hereinafter).

In that way, since the fractional part data CDL expresses amounts of delay that are less than the delay time of a delay element DU, it becomes possible to set the period of the clock signal CKO with a high degree of precision, i.e., to a higher resolution than the delay time of a delay element DU.

Furthermore, due to the fact that the period measurement section 20 of the clock signal generating circuit 1 incorporates the period counter 21 and the output section 40 incorporates the down-counter 45, for respectively counting numbers of times that the pulse signal circulates around the pulse delay circuit 10, the number of delay elements DU required to constitute the pulse delay circuit 10 can be minimized. This enables the overall circuit size to be reduced, while enabling a wide range of frequencies of the reference signal CKI to be used, and enabling a wide range of possible frequency values for the clock signal CKO.

Moreover, with the clock signal generating circuit 1 of the above embodiment, stable operation is ensured due to the fact that the delay times of the delay elements DU of the pulse delay circuit 10 are used both as the units for measuring the period of the reference signal CKI and also as the units for generating the clock signal CKO.

Furthermore, the clock signal generating circuit 1 can be advantageously utilized with a detector circuit (for example as described in Japanese patent publication No. 2005-102129) which generates an I-signal and Q-signal (in-phase signal and quadrature signal) by using results of sampling at four times a carrier frequency. That is to say, by using a detector circuit employing the clock signal generating circuit 1, a simple low-cost communication apparatus can be configured, for application to a plurality of communication system which operate with respectively different frequencies.

Second Embodiment

A second embodiment will be described in the following.

Configuration

Figure 7:
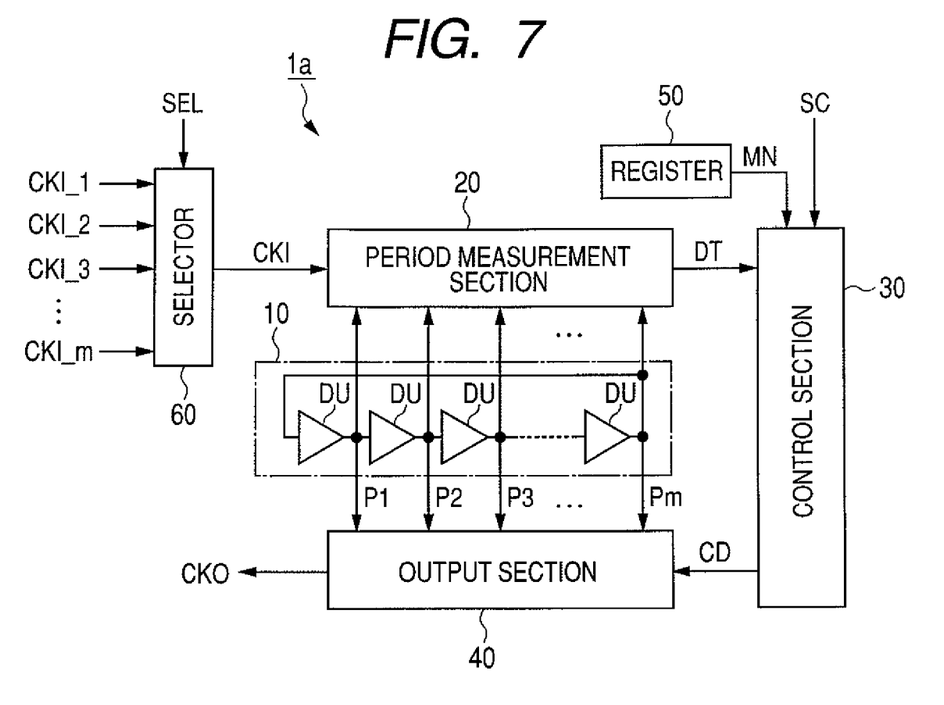
FIG. 7 is a block diagram showing the overall configuration of a second embodiment of a clock signal generating circuit.

FIG. 7 is a block diagram showing the overall configuration of this embodiment, which is a clock signal generating circuit 1*a*. The clock signal generating circuit 1*a* differs only partially from the clock signal generating circuit 1 described above, and parts of the clock signal generating circuit 1*a* which correspond to parts of the clock signal generating circuit 1 are designated by corresponding reference numerals to those of the first embodiment, with detailed description of these being omitted and with the description being centered on the points of difference.

The clock signal generating circuit 1*a* includes a signal selector 60 which selectively supplies one of a plurality of reference signals CKI_1~CKI_n having respectively different frequencies (where n is an integer) to the period measurement section 20, as the reference signal CKI. The selection is performed in accordance with an externally supplied selection signal SEL.

Effects

With the clock signal generating circuit 1*a* of this embodiment, the clock signal CKO can be generated with a wider range of possible frequency values than for the first embodiment, due to the fact that the frequency of the reference signal CKI can be switched by means of the signal selector 60.

Other Embodiments

It should be noted that various other embodiments could be envisaged, which fall within the scope claimed for the invention as set out in the appended claims.

For example, with the above embodiments, the control data CD is made up of integer part high-order data CDH, integer part low-order data CDM and fractional part data CDL. However it would be possible to omit either or both of the integer part high-order data CDH and fractional part data CDL.

If the integer part high-order data CDH is omitted, then it would become possible to omit the CDH register 411, the preset value setting section 431, and the down-counter 45. If the fractional part data CDL is omitted, then it would become possible to omit the CDL register 415 and the adjustment flag setting section 437. The circuit configuration could thereby be simplified.

Furthermore, if the circuit is used such that the value expressed by the period data DT does not exceed the total number (m) of delay elements of the pulse delay circuit, then it becomes possible to omit the period counter 21 and latch circuit 23 of the period measurement section 20.

Moreover with the above embodiments, both the divider circuit 31 and multiplier circuit 33 are provided in the control section 30, and are selected by switching. However it would be equally possible to omit either of these.

In that case, if for example only the divider circuit 31 is incorporated, then when it is required to perform multiplication by a multiplier X, this can be achieved by making the set value MN equal to 1/X. Similarly if only the multiplier circuit 33 is incorporated, then when it is required to perform division by a divisor X, this can be achieved by making the set value MN equal to 1/X.

What is claimed is:

1. A method of utilizing a clock signal generating circuit, said clock signal generating circuit comprising:

a pulse delay circuit comprising a plurality of delay elements sequentially connected in a ring configuration and configured to successively transfer a pulse signal through said delay elements, with traversal signals being thereby successively produced by said delay elements;

period measurement circuitry coupled to receive a reference signal having a predetermined fixed value of period, configured to detect said value of period of the reference signal as a number of stages of said delay elements that are traversed by said pulse signal and for generating period data expressing said value of period in units of an average delay time of said delay elements;

a register having stored therein a predetermined set value;

control circuitry configured to multiply said period data by said set value when a value of period of said clock signal is required to be determined by frequency division of said reference signal and to divide said period data by said set value when said value of period of the clock signal is required to be determined by frequency multiplication of said reference signal, for thereby obtaining control data expressing said required value of clock signal period; and output circuitry configured to generate said clock signal based on said traversal signals, with said clock signal having said value of period that is expressed by said control data;

wherein said method comprises utilizing a real number as said set value;

obtaining said control data as a real number comprising an integer part and a fractional part;

during each period of said clock signal, selectively performing a first adjustment operation of setting a selection value as said integer part of said control data and a second adjustment operation of setting said selection value as said integer part incremented by one, with a ratio of occurrences of said first adjustment operation to occurrences of said second adjustment operation being determined based on said fractional part of the control data;

selecting a specific one of said delay elements in accordance with said selection value; and generating said clock signal based on respective timings of traversal signals produced from successively selected delay elements.

2. A method as claimed in claim 1, wherein said pulse delay circuit comprises $2^p$ delay elements, "p" being a positive integer, and wherein, designating a data size of said control data as "a" bits, where "a" is greater than "p", said method comprises:
  detecting each time that said pulse signal has circulated a specific number of times around said pulse delay circuit in succession, said specific number being equal to a value expressed by (a−p) high-order bits of said control data;
  when said circulation by a specific number of times is detected, selecting one of said delay elements in accordance with said selection value; and
  selecting a timing of a traversal signal produced from said selected delay element as a succeeding one of said boundary timings.

3. A clock signal generating circuit for generating a clock signal, comprising:
  a pulse delay circuit comprising a plurality of delay elements sequentially connected in a ring configuration and configured to successively transfer a pulse signal through said delay elements, with traversal signals being thereby successively produced by said delay elements;
  period measurement circuitry coupled to receive a reference signal having a predetermined fixed value of period, configured to detect said value of period of the reference signal as a number of stages of said delay elements that are traversed by said pulse signal and for generating period data expressing said value of period in units of an average delay time of said delay elements;
  a register having stored therein a predetermined set value, said set value being a real number;
  control circuitry configured to multiply said period data by said set value when a value of period of said clock signal is required to be determined by frequency division of said reference signal and to divide said period data by said set value when said value of period of the clock signal is required to be determined by frequency multiplication of said reference signal, for thereby obtaining control data expressing said required value of clock signal period;
  output circuitry configured to generate said clock signal based on said traversal signals, with said clock signal having said value of period that is expressed by said control data; and
  a selector switch controllable for selectively supplying one of a plurality of reference signals having respectively different frequencies to said period measurement circuit.

4. A clock signal generating circuit for generating a clock signal, comprising:
  a pulse delay circuit comprising a plurality of delay elements sequentially connected in a ring configuration and configured to successively transfer a pulse signal through said delay elements, with traversal signals being thereby successively produced by said delay elements;
  period measurement circuitry coupled to receive a reference signal having a predetermined fixed value of period, configured to detect said value of period of the reference signal as a number of stages of said delay elements that are traversed by said pulse signal and for generating period data expressing said value of period in units of an average delay time of said delay elements;
  a register having stored therein a predetermined set value, said set value being a real number;
  control circuitry configured to multiply said period data by said set value when a value of period of said clock signal is required to be determined by frequency division of said reference signal and to divide said period data by said set value when said value of period of the clock signal is required to be determined by frequency multiplication of said reference signal, for thereby obtaining control data expressing said required value of clock signal period; and
  output circuitry configured to generate said clock signal based on said traversal signals, with said clock signal having said value of period that is expressed by said control data;
  wherein said control circuitry generates said control data as an integer value, and said output circuitry comprises:
  a selection setting circuit configured to derive a selection value based on said control data; and
  a clock boundary signal generating circuit configured to select a specific one of said delay elements in accordance with said selection value, and to generate a clock boundary signal expressing boundary timings corresponding to respective timings of traversal signals produced from successively selected delay elements; and wherein
  said output circuitry is configured to generate said clock signal in accordance with said clock boundary signal.

5. A clock signal generating circuit as claimed in claim 4, wherein:
  said pulse delay circuit comprises $2^p$ delay elements, "p" being a positive integer, and designating a data size of said control data as "a" bits, where "a" is greater than "p", said boundary signal generating circuit comprises a counter circuit configured to generate a detection signal each time said pulse signal has circulated a specific number of times around said pulse delay circuit, said specific number being equal to a value expressed by (a−p) high-order bits of said control data; and
  said clock boundary signal generating circuit is responsive to said detection signal for selecting one of said delay elements in accordance with said selection value, and for selecting a timing of a traversal signal produced from said selected delay element as a succeeding one of said boundary timings.

6. A clock signal generating circuit as claimed in claim 4, comprising a selector switch controllable for selectively supplying one of a plurality of reference signals having respectively different frequencies to said period measurement circuit.

7. A clock signal generating circuit as claimed in claim 4, wherein said period measurement circuit comprises:
  a counter circuit configured to count a number of times said pulse signal circulates around said delay circuit;
  a latch circuit configured to latch a count value that is obtained by said counter circuit; and
  a latch encoding circuit configured to execute a latch operation at each occurrence of an edge of said reference signal, said edge being fixedly predetermined as a rising edge or as a falling edge, for thereby latching a traversal signal that is being outputted from one of said delay elements at a timing of said edge, and to encode a position of said traversal signal with respect to said delay circuit as binary data.

8. A clock signal generating circuit for generating a clock signal, comprising:
  a pulse delay circuit comprising a plurality of delay elements sequentially connected in a ring configuration and configured to successively transfer a pulse signal through said delay elements, with traversal signals being thereby successively produced by said delay elements;

period measurement circuitry coupled to receive a reference signal having a predetermined fixed value of period, configured to detect said value of period of the reference signal as a number of stages of said delay elements that are traversed by said pulse signal and for generating period data expressing said value of period in units of an average delay time of said delay elements;

a register having stored therein a predetermined set value, said set value being a real number;

control circuitry configured to multiply said period data by said set value when a value of period of said clock signal is required to be determined by frequency division of said reference signal and to divide said period data by said set value when said value of period of the clock signal is required to be determined by frequency multiplication of said reference signal, for thereby obtaining control data expressing said required value of clock signal period; and output circuitry configured to generate said clock signal based on said traversal signals, with said clock signal having said value of period that is expressed by said control data;

wherein:

said control circuitry generates said control data as a real number formed of an integer part and a fractional part;

said output circuitry comprises an adjustment circuit configured to operate during each period of said clock signal to selectively perform a first adjustment operation of setting a selection value as said integer part of said control data and a second adjustment operation of setting said selection value as said integer part incremented by one, with a ratio of occurrences of said first adjustment operation to occurrences of said second adjustment operation being determined based on said fractional part of the control data, and a clock boundary signal generating circuit configured to operate during each period of said clock signal to select a specific one of said delay elements in accordance with said selection value, and to thereby generate a clock boundary signal expressing boundary timings corresponding to respective timings of traversal signals produced from successively selected delay elements;

and wherein said output circuitry generates said clock signal in accordance with said clock boundary signal.

9. A clock signal generating circuit as claimed in claim 8, wherein said pulse delay circuit comprises $2^p$ delay elements, "p" being a positive integer, and wherein, designating a data size of said control data as "a" bits, where "a" is greater than "p", said boundary signal generating circuit comprises:

a counter circuit configured to generate a detection signal each time that said pulse signal has circulated a specific number of times around said pulse delay circuit, said specific number being expressed by (a–p) high-order bits of said control data, and a timing selection circuit configured to obtain each of said boundary timings in response to respective occurrences of said detection signal;

wherein immediately subsequent to an occurrence of said detection signal, said timing selection circuit sets said selection value as "p" low-order bits of said control data, selects a specific one of said delay elements in accordance with said selection data, and obtains an immediately succeeding one of said boundary timings as a timing of a traversal signal produced from said specific delay element.

10. A clock signal generating circuit as claimed in claim 8, wherein said period measurement circuit comprises:

a counter circuit configured to count a number of times said pulse signal circulates around said delay circuit;

a latch circuit configured to latch a count value that is obtained by said counter circuit; and a latch encoding circuit configured to execute a latch operation at each occurrence of an edge of said reference signal, said edge being fixedly predetermined as a rising edge or as a falling edge, for thereby latching a traversal signal that is being outputted from one of said delay elements at a timing of said edge, and to encode a position of said traversal signal with respect to said delay circuit as binary data.

11. A clock signal generating circuit as claimed in claim 8, comprising a selector switch controllable for selectively supplying one of a plurality of reference signals having respectively different frequencies to said period measurement circuit.

* * * * *